(12) United States Patent
Imaizumi et al.

(10) Patent No.: US 9,059,143 B2
(45) Date of Patent: Jun. 16, 2015

(54) SEMICONDUCTOR DEVICE

(75) Inventors: Yukari Imaizumi, Kanagawa (JP); Goshi Kawazu, Kanagawa (JP); Isao Kudo, Kanagawa (JP); Akio Katsumata, Kanagawa (JP); Yoichi Hiruta, Oita (JP)

(73) Assignee: J-DEVICES CORPORATION, Tokyo (JP)

( * ) Notice: Subject to any disclaimer, the term of this patent is extended or adjusted under 35 U.S.C. 154(b) by 206 days.

(21) Appl. No.: 13/075,890

(22) Filed: Mar. 30, 2011

(65) Prior Publication Data

US 2012/0025367 A1 Feb. 2, 2012

(30) Foreign Application Priority Data

Jul. 28, 2010 (JP) ................................. 2010-169574

(51) Int. Cl.
*H01L 23/28* (2006.01)
*H01L 23/34* (2006.01)
(Continued)

(52) U.S. Cl.
CPC ......... *H01L 23/4334* (2013.01); *H01L 23/3128* (2013.01); *H01L 24/16* (2013.01); *H01L 24/29* (2013.01); *H01L 24/30* (2013.01); *H01L 24/32* (2013.01); *H01L 24/45* (2013.01); *H01L 24/48* (2013.01); *H01L 24/73* (2013.01); *H01L 25/0655* (2013.01); *H01L 25/0657* (2013.01); *H01L 2224/16145* (2013.01); *H01L 2224/29036* (2013.01); *H01L 2224/291* (2013.01); *H01L 2224/2919* (2013.01); *H01L 2224/30505* (2013.01); *H01L 2224/32225* (2013.01); *H01L 2224/32245* (2013.01); *H01L 2224/45144* (2013.01); *H01L 2224/45147* (2013.01); *H01L 2224/48227* (2013.01); *H01L 2224/73204* (2013.01); *H01L 2224/73207* (2013.01); *H01L 2224/73253* (2013.01);
(Continued)

(58) Field of Classification Search
CPC ............................ H01L 23/36; H01L 23/4334
USPC ............................ 257/706, 713, E23.08, 796
See application file for complete search history.

(56) References Cited

U.S. PATENT DOCUMENTS 5,552,635 A * 9/1996 Kim et al. ..................... 257/706
5,736,785 A * 4/1998 Chiang et al. ................. 257/712
(Continued)

FOREIGN PATENT DOCUMENTS

DE 19500422 A1 7/1995
JP 04-123441 4/1992
(Continued)

OTHER PUBLICATIONS

Office Action issued by Japan Patent Office dated Apr. 23, 2013 (Counter Japanese Application: JP2010-169574).
(Continued)

*Primary Examiner* — Nitin Parekh
(74) *Attorney, Agent, or Firm* — Staas & Halsey LLP

(57) ABSTRACT

A semiconductor device which includes a substrate, a semiconductor element arranged on the substrate, a heat dissipation component arranged on the semiconductor element, and a mold component covering an upper part of the substrate, the semiconductor element and the heat dissipation component, wherein an area of a surface on the semiconductor element of the heat dissipation component is larger than an area of a surface on which the heat dissipation component of the semiconductor element is arranged.

15 Claims, 14 Drawing Sheets

(51) Int. Cl.
    *H01L 23/433*     (2006.01)
    *H01L 25/065*     (2006.01)
    *H01L 23/31*     (2006.01)
    *H01L 23/00*     (2006.01)

(52) U.S. Cl.
    CPC ........... *H01L 2224/73265* (2013.01); *H01L 2225/0651* (2013.01); *H01L 2225/06513* (2013.01); *H01L 2225/06589* (2013.01); *H01L 2924/15311* (2013.01); *H01L 2924/01019* (2013.01); *H01L 2924/01079* (2013.01); *H01L 2924/01014* (2013.01); *H01L 2224/32145* (2013.01); *H01L 2924/3011* (2013.01); *H01L 2924/01047* (2013.01)

(56) References Cited

U.S. PATENT DOCUMENTS

| | | | |
|---|---|---|---|
| 5,901,041 A * | 5/1999 | Davies et al. | 361/704 |
| 5,977,626 A | 11/1999 | Wang et al. | |
| 6,208,519 B1 * | 3/2001 | Jiang et al. | 361/717 |
| 6,265,771 B1 * | 7/2001 | Ference et al. | 257/706 |
| 6,369,455 B1 * | 4/2002 | Ho et al. | 257/796 |
| 6,400,014 B1 | 6/2002 | Huang et al. | |
| 6,614,123 B2 | 9/2003 | Lee et al. | |
| 6,737,755 B1 | 5/2004 | McLellan et al. | |
| 7,122,911 B2 | 10/2006 | Yang | |
| 7,180,173 B2 | 2/2007 | Kuo et al. | |
| 7,247,929 B2 | 7/2007 | Miura et al. | |
| 8,030,756 B2 * | 10/2011 | Lee et al. | 257/706 |
| 8,154,881 B2 * | 4/2012 | Jones | 361/800 |
| 8,415,809 B2 * | 4/2013 | Kang | 257/778 |
| 2001/0009302 A1 | 7/2001 | Murayama et al. | |
| 2001/0042863 A1 | 11/2001 | Yamada et al. | |
| 2005/0003585 A1 * | 1/2005 | Combs et al. | 438/122 |
| 2005/0095875 A1 * | 5/2005 | Huang et al. | 438/800 |
| 2006/0038278 A1 * | 2/2006 | Wang | 257/698 |
| 2007/0181997 A1 * | 8/2007 | Ahr et al. | 257/712 |
| 2008/0112150 A1 | 5/2008 | Jones | |

FOREIGN PATENT DOCUMENTS

| | | |
|---|---|---|
| JP | 7-254668 | 10/1995 |
| JP | 10-163022 | 6/1998 |
| JP | 2000-174173 | 6/2000 |
| JP | 2001-44358 | 2/2001 |
| JP | 2001-210761 | 8/2001 |
| JP | 2004-296588 | 10/2004 |
| JP | 2005-217405 | 8/2005 |
| JP | 2006-049542 | 2/2006 |
| JP | 2007-214602 | 8/2007 |
| JP | 2007-305761 | 11/2007 |
| JP | 2009-246032 | 10/2009 |
| JP | 2009-302281 | 12/2009 |
| JP | 20009-302556 | 12/2009 |
| JP | 2011-530190 | 12/2011 |
| WO | WO 2010-016890 | 2/2010 |

OTHER PUBLICATIONS

Japanese Notification of Reasons for Refusal dated Oct. 22, 2013 in Japanese Application 2010-169574.
Taiwanese Final Rejection dated Jul. 31, 2014 in Taiwanese Patent Application No. 100105916.
Taiwanese Office Action dated Mar. 27, 2014 in Taiwanese Patent Application No. 100105916.
Japanese Final Rejection mailed May 27, 2014 in Japanese Patent Application No. 2010-169574.
Japanese Decision of Rejection of Amendment mailed May 27, 2014 in Japanese Patent Application No. 2010-169574.
Japan Office Action mailed Oct. 22, 2013 in Japanese Patent Application No. 2010-169574.
Chinese Office Action mailed Feb. 25, 2015 in related Chinese Application No. 201110061649.0.

* cited by examiner

Fig. 17

| Thickness of a heat dissipation component t[mm] | Length of one side of a heat dissipation component [mm] | Heat resistance θja [degC/W] |
|---|---|---|
| 0.3 | 27.7 | 7.9 |
| | 20.0 | 8.6 |
| | 10.0 | 10.6 |
| 0.5 | 27.7 | 7.5 |
| | 20.0 | 8.3 |
| | 10.0 | 10.5 |
| 0.7 | 27.7 | 7.3 |
| | 20.0 | 8.3 |
| | 10.0 | 10.5 |

Fig. 18

| Thickness of a heat dissipation component t[mm] | Length of one side of a heat dissipation component [mm] | Heat resistance θjc [degC/W] |
|---|---|---|
| 0.3 | 27.7 | 1.0 |
| 0.3 | 20.0 | 1.0 |
| 0.3 | 16.0 | 1.1 |
| 0.3 | 10.0 | 1.4 |
| 0.5 | 27.7 | 0.7 |
| 0.5 | 20.0 | 0.7 |
| 0.5 | 10.0 | 1.0 |
| 0.7 | 27.7 | 0.5 |
| 0.7 | 20.0 | 0.5 |
| 0.7 | 10.0 | 0.6 |

| Thermal conductivity of a mold component [W/mK] | Area ratio of a semiconductor element with respect to a heat dissipation component | Thickness of a heat dissipation component t[mm] |
|---|---|---|
| 0.6 | 7.1 | 0.1 |
| 0.6 | 5.7 | 0.3 |
| 0.6 | 5.3 | 0.5 |
| 1.0 | 6.2 | 0.1 |
| 1.0 | 4.9 | 0.3 |
| 1.0 | 4.6 | 0.5 |
| 3.1 | 4.6 | 0.1 |
| 3.1 | 3.6 | 0.3 |
| 3.1 | 3.4 | 0.5 |

Fig. 19

SEMICONDUCTOR DEVICE

CROSS-REFERENCE TO RELATED APPLICATIONS

This application is based upon and claims the benefit of priority from the prior Japanese Patent Application No. 2010-169574, filed on 28 Jul. 2010, the entire contents of which are incorporated herein by reference.

FIELD

The present invention is related to a semiconductor device, in particular, the present invention is related to a semiconductor device which includes a heat dissipation component which dissipates heat being generated when operating a semiconductor element.

BACKGROUND

Recently, high speed operation of semiconductor devices is being demanded together with high functionality of the electronic devices which use these semiconductor devices which leads to an increase in the amount of heat being generated when operating a semiconductor element. Because operation errors occur due to an increase in the temperature of a semiconductor element when operating the semiconductor element, operation reliability decreases and therefore, a means for dissipating the heat generated when operating the semiconductor element is required.

A cross sectional view of a conventional semiconductor device which is not mounted with a heat dissipation component is shown in FIG. 1.

In the conventional semiconductor device 10, a semiconductor element 3 is mounted on a substrate 1 with an adhesive 2 and the semiconductor element 3 is connected to the substrate using a bonding wire 4 made from a material such as Au or Cu etc. The periphery of the semiconductor element 3 is molded by a mold component 5 having epoxy etc. as its main raw material. In the semiconductor device 10, heat which is generated when the semiconductor element 3 operates is thermally conducted to the mold component 5 on the semiconductor element 3 and dissipates by thermal conduction to the air from the surface of the mold component 5.

In addition, in FIG. 2 or FIG. 3, a method is shown for improving the heat dissipation of semiconductor devices 20, 30 by mounting a heat dissipation component 7, 31 comprised from metal etc. on the surface of the mold component 5, and increasing the thermal conductivity of the mold component by about 3 [W/mK]. Heat resistance of a semiconductor device decreases by about 10-15% in a semiconductor device which includes this heat dissipation component compared to a semiconductor device which does not include a heat dissipation component.

In Patent Document 1 (Japan Laid Open Patent 2007-305761) an example is shown whereby a heat dissipation plate is attached to a semiconductor element by a conductivity paste and an upper surface side of an edge part of the heat dissipation plate is supported by a heat dissipation plate push part. In this example, heat generated from the semiconductor element is conducted to the heat dissipation plate by the conductivity paste and dissipates from a thermal conduction means such as a heat sink arranged on the heat dissipation plate to the air.

In addition, in Patent Document 2 (Japan Laid Open Patent 2001-210761) an example of shown whereby a sheet shaped heat dissipation plate is arranged by an adhesive on the semiconductor element so as to cover the semiconductor element. In this example, heat generated from the semiconductor element is conducted to the heat dissipation plate by the adhesive and dissipates by thermal conduction to the air from the heat dissipation plate.

However, environments in which a heat sink is not or can not be mounted on a semiconductor device are increasing due to the increasing thinness and small scale of recent electronic devices, and a means for further reducing the temperature of a semiconductor element, that is, reducing the heat resistance of a semiconductor device in such environments, is being demanded. As such a means, in a semiconductor device mounted with heat dissipation components 7, 31 comprised of metal etc., on the surface of a mold component so as to be exposed to the air as in the conventional semiconductor device shown in FIG. 2 or FIG. 3, the mold component 5 with a thickness of tens of [μm] to hundreds of [μm] is sandwiched between heat dissipation components 7, 31 and the semiconductor element 3, the thermal conductivity of the mold component 5 is about 0.5-3 [W/mK] which is a low thermal conductivity compared to metal etc., therefore heat resistance is large and the heat generated from the semiconductor element 3 does not diffuse sufficiently within the mold component 5. In addition, in the conventional semiconductor devices 20, 30 mounted with heat dissipation components 7, 31 which are exposed to the air, because the heat dissipation area up to the heat dissipation components 7, 31 which allow heat generated from the surface of the semiconductor element 3 to dissipate is limited, sufficient heat dissipation effects can not be obtained from the surface of the semiconductor device.

Therefore, heat is not sufficiently dissipated from the surface of the semiconductor devices 20, 30 having this conventional structure, and is limited as a means for reducing the temperature of the semiconductor element 3.

The present invention aims to effectively diffuse heat generated when a semiconductor element operates within a mold component, improve heat dissipation of a semiconductor device and reduce heat resistance.

SUMMARY

The semiconductor device related to the present invention includes a substrate, a semiconductor element arranged on the substrate, a heat dissipation component arranged on the semiconductor element, and a mold component covering an upper part of the substrate, the semiconductor element and the heat dissipation component, wherein an area of a surface arranged on the semiconductor element of the heat dissipation component is larger than an area of a surface on which the heat dissipation component of the semiconductor element is arranged.

In the semiconductor device related to another embodiment of the present invention, the heat dissipation component may be comprised of a one or plurality of stacked parts.

In the semiconductor device related to another embodiment of the present invention, a side surface of the heat dissipation component may have bumps.

In the semiconductor device related to another embodiment of the present invention, a side surface of the heat dissipation component may have a flat shape.

In the semiconductor device related to another embodiment of the present invention, the heat dissipation component may be fixed on the semiconductor element by an adhesive.

In the semiconductor device related to another embodiment of the present invention, the heat dissipation component may be fixed on a semiconductor element which is stacked on a semiconductor element by an adhesive.

In the semiconductor device related to another embodiment of the present invention, the heat dissipation component is fixed on a spacer which is stacked on the semiconductor element by an adhesive.

In the semiconductor device related to another embodiment of the present invention, the adhesive may be grease.

In the semiconductor device related to another embodiment of the present invention, the adhesive may be a thermal interface material.

In the semiconductor device related to another embodiment of the present invention, the adhesive may be a paste.

In the semiconductor device related to another embodiment of the present invention, a surface of the heat dissipation component which is arranged on the semiconductor element may be not flat.

In the semiconductor device related to another embodiment of the present invention, a surface of the heat dissipation component which is arranged on the semiconductor element may include bumps.

In the semiconductor device related to another embodiment of the present invention, a surface of the heat dissipation component which is arranged on the semiconductor element may include slits.

In the semiconductor device related to another embodiment of the present invention, a surface of the heat dissipation component which is arranged on the semiconductor element may include holes.

According to the present invention, it is possible to effectively diffuse heat generated when a semiconductor element is operated, within a mold component, improve heat dissipation of the semiconductor device and reduce heat resistance by burying a heat dissipation component within a mold component in the semiconductor device, the heat dissipation component having a smaller area than a conventional heat dissipation component.

BRIEF DESCRIPTION OF THE DRAWINGS

FIG. 4 (B) is a cross sectional view of the line A-A' in FIG. 4 (A);

FIG. 7 (B) is a cross sectional view related to a fourth embodiment of the present invention;

FIG. 17 is a chart which shows numerical values of each plot shown in FIG. 14;

FIG. 18 is a chart which shows numerical values of each plot shown in FIG. 15;

FIG. 19 is a chart which shows numerical values of each plot shown in FIG. 16;

FIG. 20(B) is a cross sectional view of the line B-B' in FIG. 20 (A).

DESCRIPTION OF EMBODIMENTS

Figure 1:
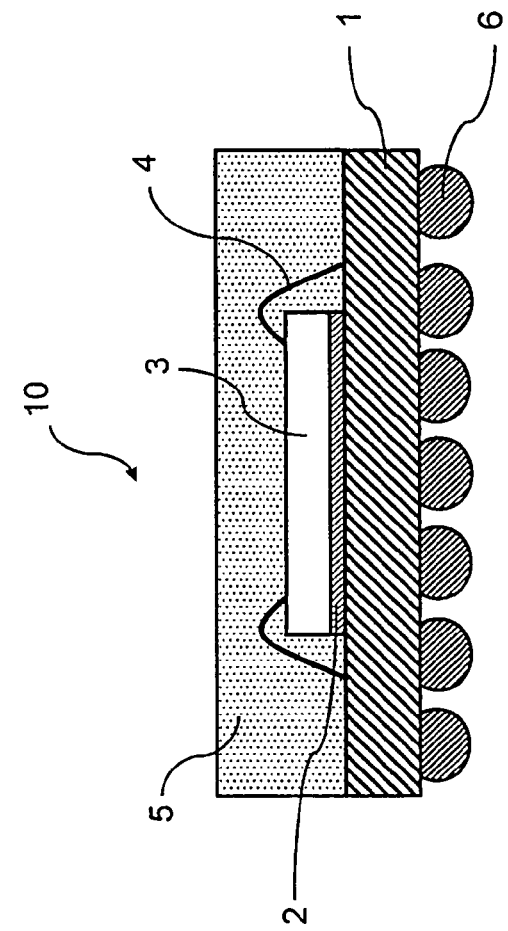
FIG. 1 is a cross sectional view which shows a semiconductor device which is not mounted with a conventional heat dissipation component.

The embodiments of the present invention will be explained below while referring to the drawings. Furthermore, the same structural elements have the same reference numerals and overlapping explanations between embodiments are omitted.

First Embodiment

A semiconductor device related to the first embodiment of the present invention will be explained while referring to the diagrams.

(Structure of the Semiconductor Device)

Figure 4:
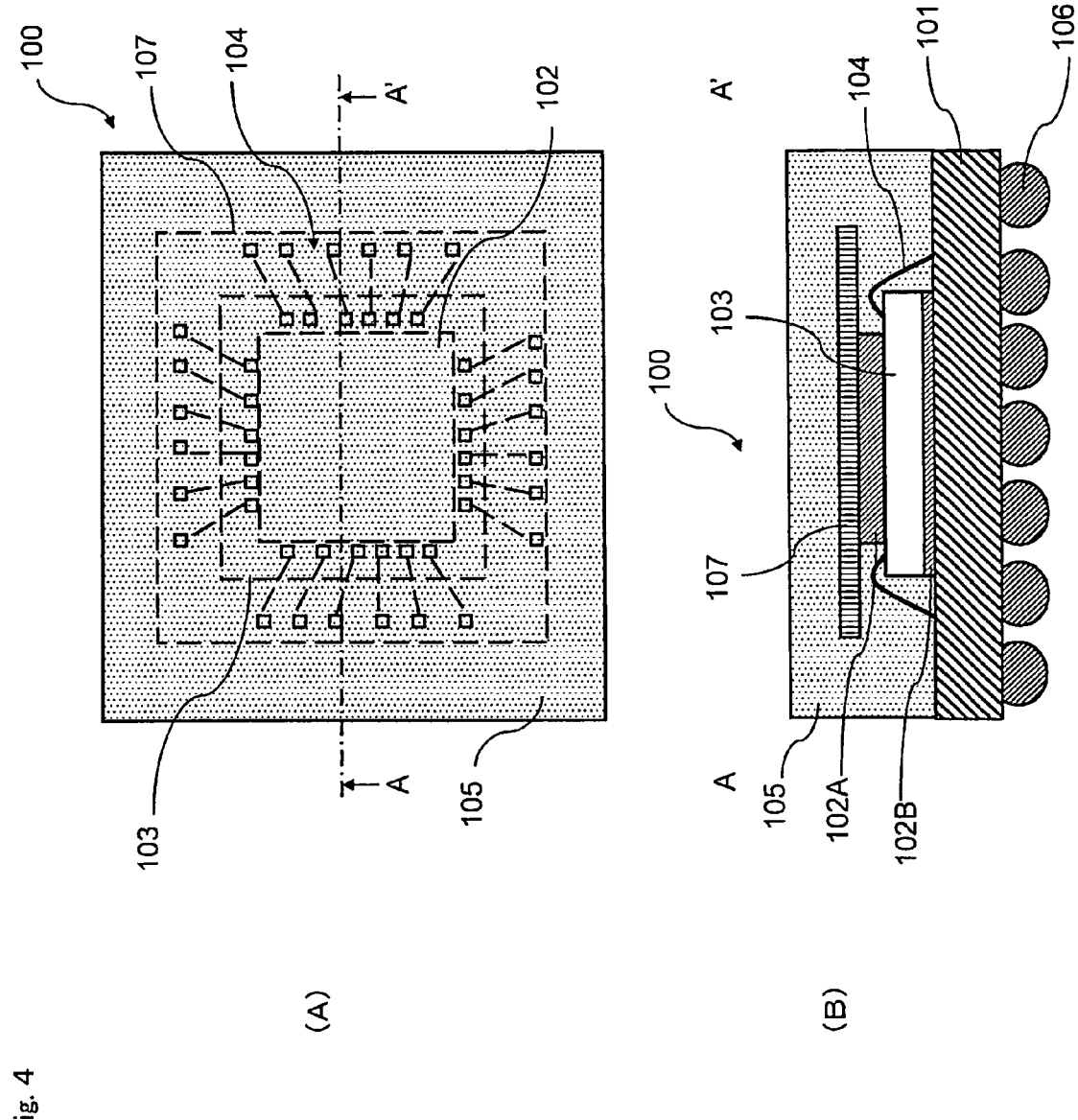
FIG. 4 (A) is a plane view which shows a general structure of a semiconductor device related to a first embodiment of the present invention.

FIG. 4 (A) and FIG. 4 (B) show general structures of a semiconductor device 100 related to the first embodiment. FIG. 4 (A) is a plane view which shows a general structure of the semiconductor device 100 and FIG. 4 (B) is a cross sectional view of the semiconductor device seen from the line A-A' in FIG. 4 (A). In FIG. 4 (A) and FIG. 4 (B), the semiconductor device 100 is arranged with a substrate 101, a semiconductor element 103 arranged on the substrate 101 by an adhesive 102B, a heat dissipation component 107 arranged on the semiconductor element 103 by an adhesive 102A, and a mold component 105 covering the upper part of the substrate 101, the semiconductor element 103 and the heat dissipation component 107.

As a method of manufacturing the semiconductor device of the first embodiment, first, the heat dissipation component 107 is mounted on the upper surface of the semiconductor element 103 mounted on the substrate 101 by the adhesive 102A made from Ag paste for example. The adhesive 102A is not limited Ag paste, and while a sheet shaped paste can be used, a material having as high a thermal conductivity as possible is preferred. In addition, a material having a higher thermal conductivity than the mold component 105, for example, Cu etc., is used in the heat dissipation component 107. Apart from Cu, a metal or ceramic can also be used for the material of the heat dissipation component 107. By molding the semiconductor element 103 and the heat dissipation component 107 with the mold component 105 on the substrate 101 manufactured in this way, the semiconductor device 100 with the dissipation component 107 buried with the mold component 105 is manufactured. The mold component 105 may also be comprised of a resin.

Figure 8:
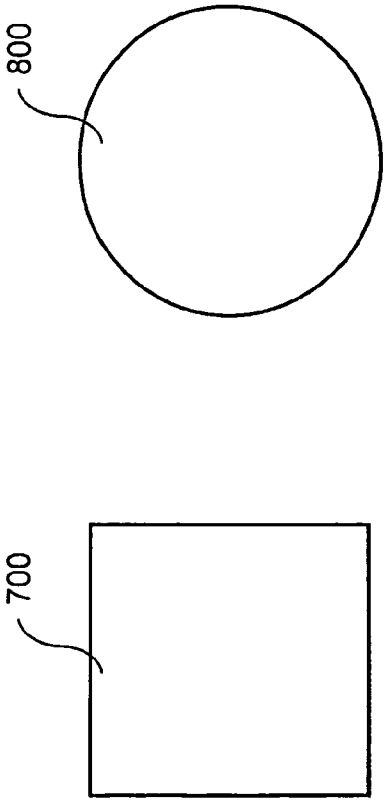
FIG. 8 is a plane view which shows an example in which the external shape of a heat dissipation component of the semiconductor device related to another embodiment of the present invention is changed.

As is shown in FIG. 4 (A), the heat dissipation component 107 is formed with a larger area than the area of a heat generating surface (upper surface in the diagram) of the semiconductor element 103. In FIG. 4 (A), the heat dissipation component 107 has a square shape as shown in FIG. 8. However, the shape of the heat dissipation component 107 is not limited to a square shape. The shape can be appropriately changed as long as the surface on which the semiconductor element of the heat dissipation component is arranged is larger than the heat generating surface of the semiconductor element. A circle or polygon as shown in FIG. 9 to FIG. 13 for example are specific examples of another shape of the heat dissipation component.

As is shown in FIG. 4 (B), in the semiconductor device 100 related to the first embodiment, the surface of the heat dissipation component 107 is not exposed on the surface of the semiconductor device 100. The entire heat dissipation component 107 is buried within the mold component, and the heat conducted to the heat dissipation component 107 from the semiconductor element 103 is transferred to the substrate 101 and the mold component 105, thermally conducted to the air from the surface of the semiconductor device 100, thermally radiated by a whole extent of the semiconductor device 100. In addition, the heat conducted to the heat dissipation component 107 from the semiconductor element 103 is thermally conducted through the interior of the mold component and transferred or thermally radiated from the surface of the semiconductor device 100, and thermally conducted to the mounting board through the substrate 101 and solder balls 106.

In the conventional semiconductor devices 10, 20, 30, because the mold component 5 with a low thermal conductivity lies in the dissipation path of heat generated from the semiconductor element 103 heat is not sufficiently diffused in the mold component 5 even in the semiconductor devices 20, 30 which are mounted on their upper parts with the heat dissipation components 7, 31, sufficient heat dissipation effects could not be obtained because the heat dissipation area up to the heat dissipation components 7, 31 is limited. However, in the semiconductor device 100 related to the present invention, by arranging the heat dissipation component 107 which includes a larger surface area than the area of the heat generating surface area of the semiconductor element 103 within the mold component 105 near the semiconductor element 103, heat generated from the semiconductor element 103 is effectively diffused within the mold component 105 on the semiconductor element 103 by the heat dissipation component 107, that is, by increasing the heat dissipation area, it is possible to improve heat dissipation of the semiconductor device 100.

Figure 2:
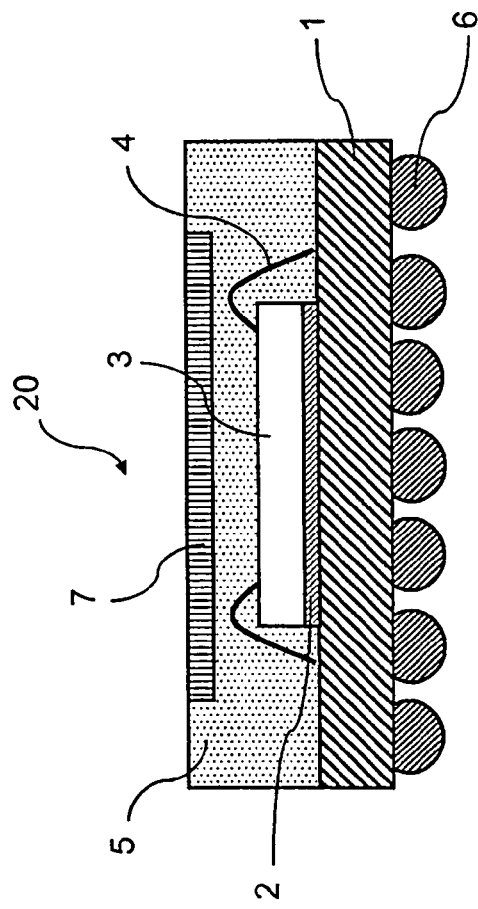
FIG. 2 is a cross sectional view which shows an example of a semiconductor device which is mounted with a conventional heat dissipation component.
Figure 3:
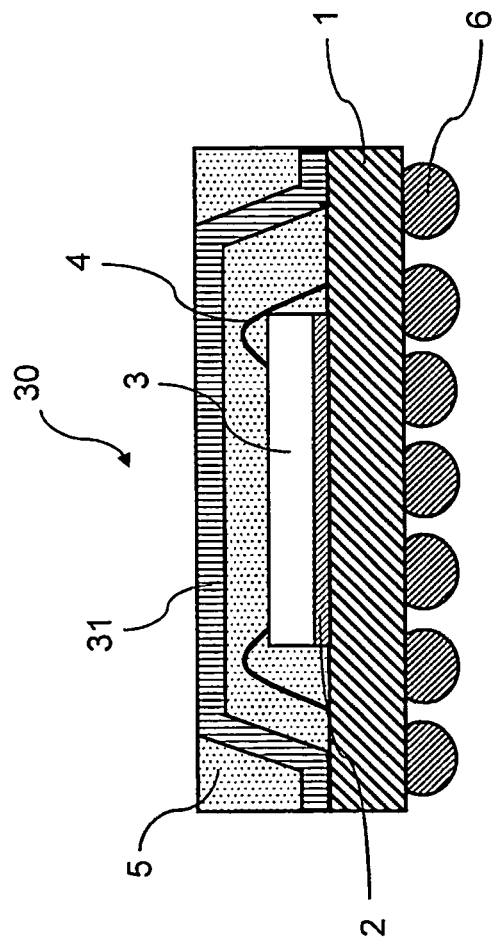
FIG. 3 is a cross sectional view which shows an example of a semiconductor device which is mounted with a conventional heat dissipation component.

In this way, according to the present invention, by mounting a heat dissipation component 107 with a higher thermal conductivity and with a larger size than the semiconductor element 103 on the semiconductor device 100, it is possible to transfer heat generated from the semiconductor element 103 to the mold component 105 on the semiconductor element 103, in particular, by effectively diffusing heat in a horizontal direction within the mold component 105, it is possible to widen the heat dissipation area, that is, the heat dissipation path, up to the surface of the mold component 105 and the substrate 101 from the semiconductor element 103. Therefore, it is possible to reduce the heat resistance θ ja and θ jc more in the semiconductor device 100 related to the present invention than the semiconductor devices 20, 30 in which the heat dissipation components 7, 31 are exposed on the mold component 5 as seen in the conventional semiconductor device shown in FIG. 2 or FIG. 3.

EXAMPLE

Figure 14:
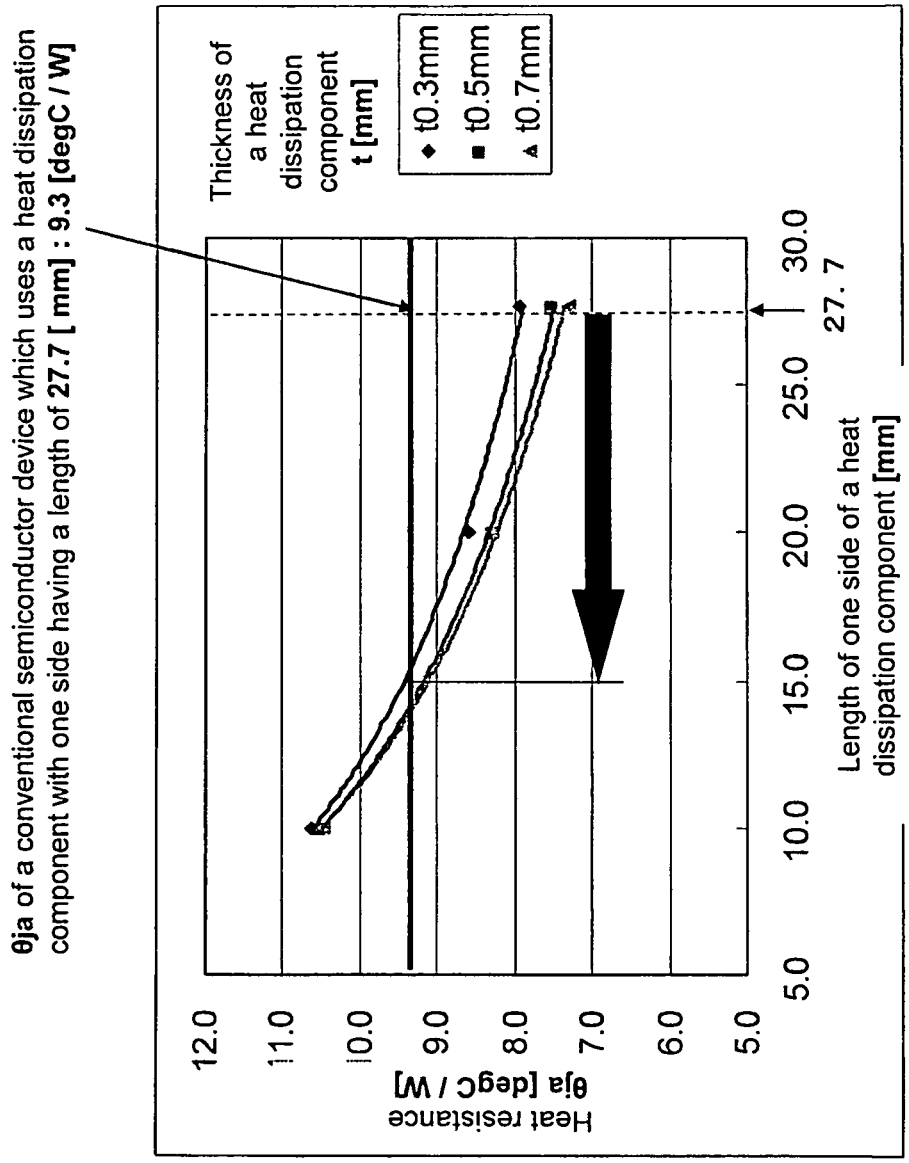
FIG. 14 is a diagram which shows the results of changing both the thickness of a heat dissipation component and length of one side of the heat dissipation component in the semiconductor device related to an embodiment of the present invention and analyzing heat resistance $\theta$ ja.
Figure 15:
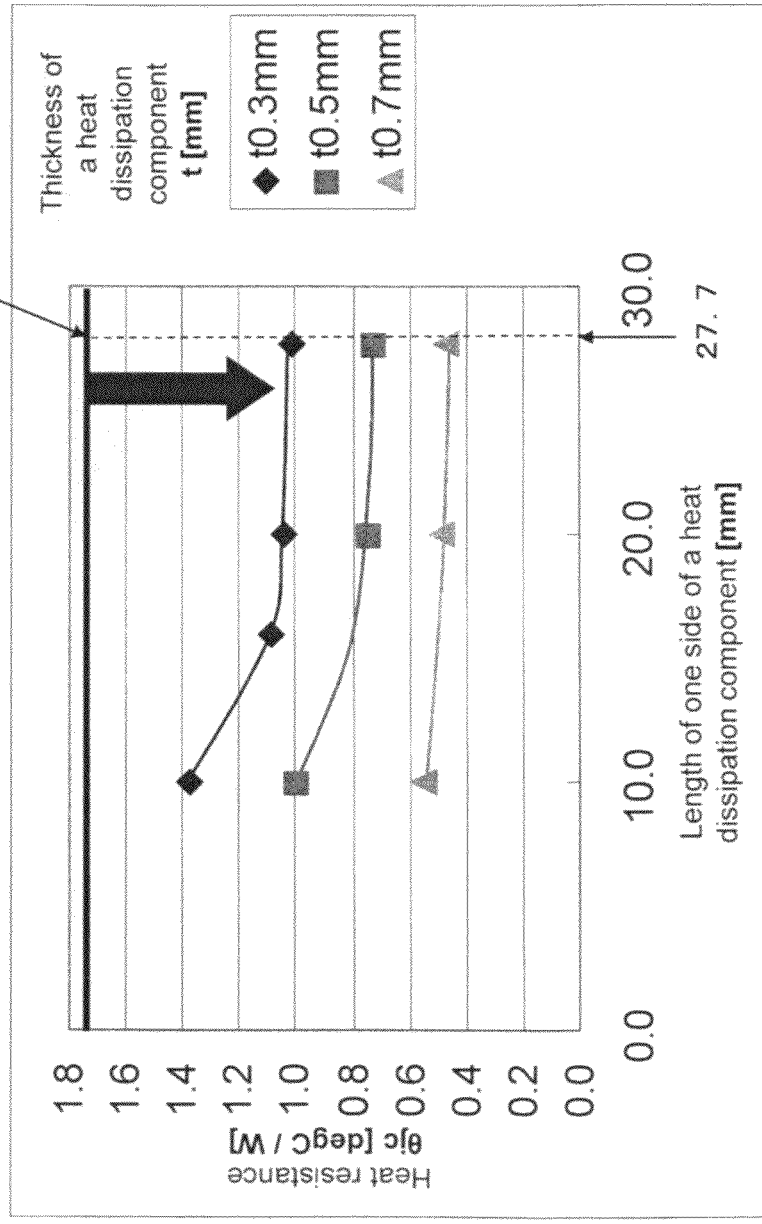
FIG. 15 is a diagram which shows heat resistance $\theta$ jc in the case where both the length and thickness of one side of a heat dissipation component is changed in the semiconductor device related to an embodiment of the present invention.
Figure 16:
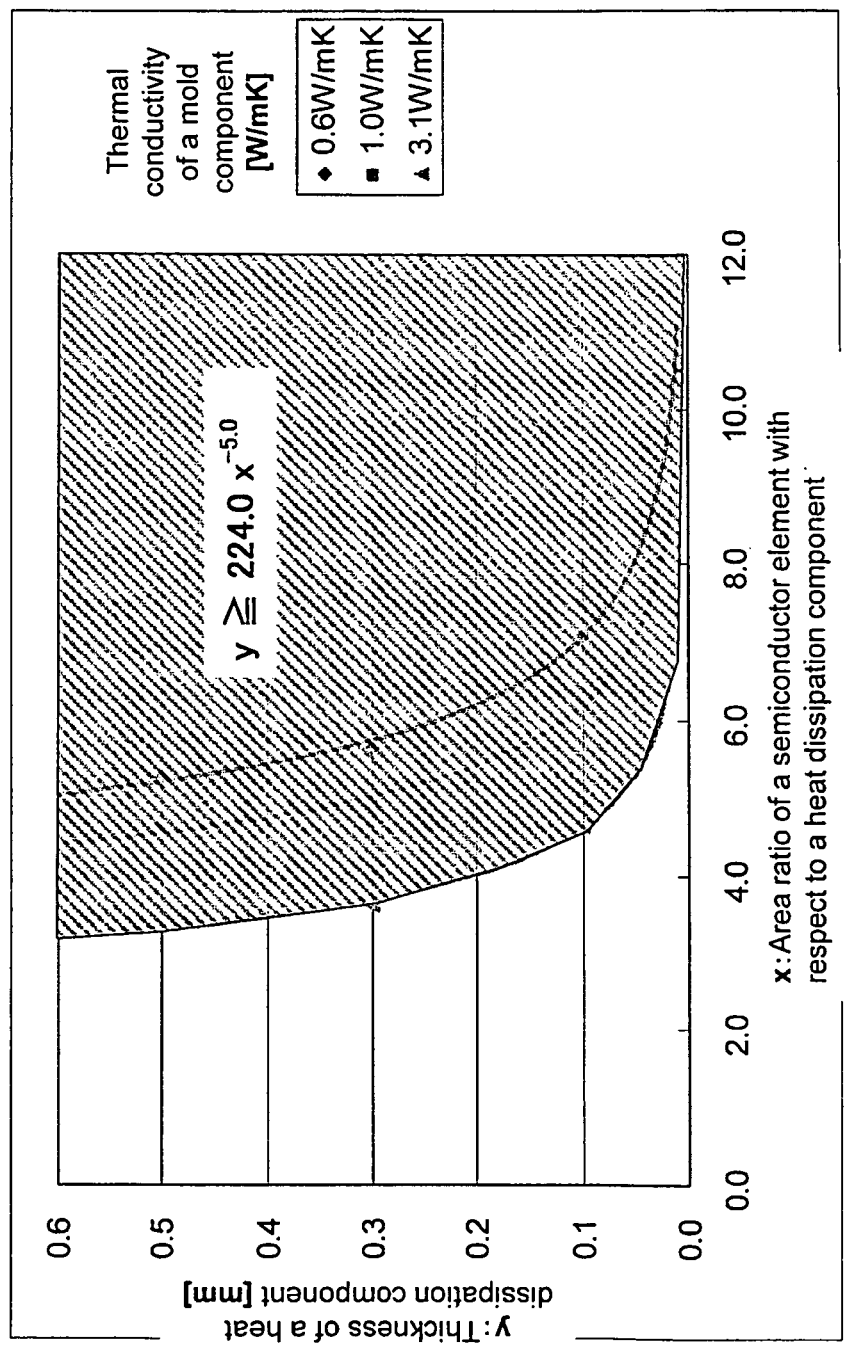
FIG. 16 is a diagram which shows the area ratio of a heat dissipation component with respect to the area of a semiconductor element which has the same $\theta$ ja level as a conventional semiconductor device in the case where both the thickness of the heat dissipation component and the heat conduction rate of a mold component are changed in the semiconductor device related to an embodiment of the present invention.

The heat dissipation of the semiconductor in the example of the present invention is explained compared to a semiconductor device having a conventional heat dissipation component based on the heat analysis results shown in FIG. 14 to FIG. 16.

FIG. 14 is a diagram which shows the results of analyzing the semiconductor device heat resistance θ ja [deg C/W] based on a JEDEC standard using thermo-fluid analysis software when the length of one side of the heat dissipation component 107 having a square shape is changed to 10 [mm], 20 [mm] and 27.7 [mm], or when the thickness t of the heat dissipation component 107 is changed to 0.3 [mm], 0.5 [mm] and 0.7 [mm], in the structure of the semiconductor device related to the present invention shown in FIG. 4.

In FIG. 14, the length of one side of the semiconductor device to be analyzed in the present example and the conventional semiconductor device is 31 [mm] and the length of one side of the semiconductor element to be analyzed in the present example and the conventional semiconductor device is 8 [mm], and analysis was performed using a heat dissipation component comprised from Cu and having a square shape as shown in FIG. 8. In addition, the numerical value of each plot shown in FIG. 14 is as shown in FIG. 17. However, the numerical value of the conventional example shown in FIG. 14 is 0.3 [mm] thickness of the heat dissipation component, 27.7 [mm] length of one side of the heat dissipation component, and heat resistance θ ja:9.3 [deg C/W] is shown in the case where the thermal conductivity of the mold component 105 is 3.1 [W/mK].

In FIG. 14, heat resistance θ ja in the example of the present invention when a heat dissipation component having one side with a length of about 27.7 [mm] is used is about 14% θ ja which is less compared to a semiconductor device having the conventional structure. In addition, because θ ja in the case of using a heat dissipation component with one side having a length of about 27.7 [mm] in the conventional semiconductor device is the same numerical value as θ ja in the case of using a heat dissipation component with one side having a length of about 15 [mm] in the example of the present invention, according to the example of the present invention it is possible to obtain the same heat dissipation effects as the conventional device even if a smaller heat dissipation component is used compared to the conventional semiconductor device.

Next, FIG. 15 is a diagram which shows the results of analyzing the semiconductor device heat resistance θ jc [deg C/W] based on a JEDEC standard using thermo-fluid analysis software when the length of one side of the heat dissipation component 107 is changed to 10 [mm], 16 [mm], 20 [mm] and 27.7 [mm], or when the thickness t of the heat dissipation component 107 is changed to 0.3 [mm], 0.5 [mm] and 0.7 [mm], in the structure of the semiconductor device related to the present invention shown in FIG. 4.

In FIG. 15, the length of one side of the semiconductor device to be analyzed in the present example and the conventional semiconductor device is 31 [mm] and the length of one side of the semiconductor element to be analyzed in the present example and the conventional semiconductor device is 8 [mm], and analysis was performed using a heat dissipation component comprised from Cu and having a square shape as shown in FIG. 8. In addition, the numerical value of each plot shown in FIG. 15 is as shown in FIG. 18. However, the numerical value of the conventional example shown in FIG. 15 is 0.3 [mm] thickness of the heat dissipation component, 27.7 [mm] length of one side of the heat dissipation component, and heat resistance θ ja:1.74 [deg C/W] is shown in the case where the thermal conductivity of the mold component 105 is 3.1 [W/m K].

According to the analysis results of θ jc shown in FIG. 15, θ jc in the case of using a heat dissipation component in the semiconductor device of the present invention with the same dimensions as the heat dissipation component having one side with a length of about 27.7 [mm], is about 42% lower than θ jc in the conventional structure. Therefore, in the case where a heat dissipation component is used with roughly the same size as a conventional component in the semiconductor device in the example of the present invention, it is possible to significantly reduce heat resistance compared to the conventional semiconductor device.

Furthermore, FIG. 16 is a diagram in which the thermal conductivity of the mold component 105 comprised of resin is changed to 0.6 [W/mK], 1.0 [W/mK], and 3.1 [W/mK], or the thickness t of the heat dissipation component 107 is changed to 0.3 [mm], 0.5 [mm], 0.7 [mm] in the structure of the semiconductor device related to the present invention shown in FIG. 14, and which shows the area ratio of a heat dissipation component which meets θ ja in the case where a heat dissipation component is used having one side with a length of 27.7 [mm] in the conventional semiconductor device.

In FIG. 16, the length of one side of the semiconductor device to be analyzed in the present example is 31 [mm] and the length of one side of the semiconductor element to be analyzed in the present example is 8 [mm], and analysis was performed using a heat dissipation component comprised from Cu and having a square shape as shown in FIG. 8. In addition, the numerical value of each plot shown in FIG. 16 is as shown in FIG. 19. The formula y≤224.0 x−0.5 described in the upper right region of FIG. 16 shows the relationship between the thickness: y [mm] of the heat dissipation component in the example of the present invention, and the area ratio: x with respect to the semiconductor element of the heat dissipation component. The same formula shows the region shown by the diagonal line in FIG. 16. The semiconductor device which satisfies the xy numerical values in the same formula includes excellent heat resistance effects compared to the conventional semiconductor device. However, the analysis results of FIG. 16 is simply an example which express the fact that the semiconductor device of the present example includes excellent heat resistance effects compared to the conventional semiconductor device. For example, when the same analysis is performed using the semiconductor device, which has a shorter size than the semiconductor device of the present example which was the object of analysis in FIG. 16, or in the case where the same analysis is performed using the semiconductor device which uses a mold component having a higher thermal conductivity than the semiconductor device of the present example used as the object of analysis in FIG. 16, even in the case where the thickness and area of the heat dissipation component is smaller than the region shown by the diagonal line in FIG. 16, it is possible to obtain the same heat dissipation effects as the conventional semiconductor device.

In this way, according to the first embodiment of the present invention, even when a heat dissipation component having the same qualities as a conventional semiconductor device is used, it is possible to obtain the same heat dissipation effects as a conventional device using a heat dissipation component with a smaller area than a convention device. In addition, because the entire surface of the semiconductor device related to the present invention is covered by the mold component 105, it is possible to improve heat emissivity from the semiconductor device surface, visibility of a mark and reduce external appearance defections of the semiconductor device compared to the structure wherein the heat dissipation component comprised from metal is exposed on the surface of a conventional semiconductor device.

Second Embodiment

The semiconductor device 200 related to the second embodiment of the present invention will be explained while referring to the diagrams. The second embodiment of the present invention explains an example where a spacer 201 is arranged between the heat dissipation component 107 and the semiconductor element 103 in the semiconductor device 100 related to the first embodiment.

Figure 5:
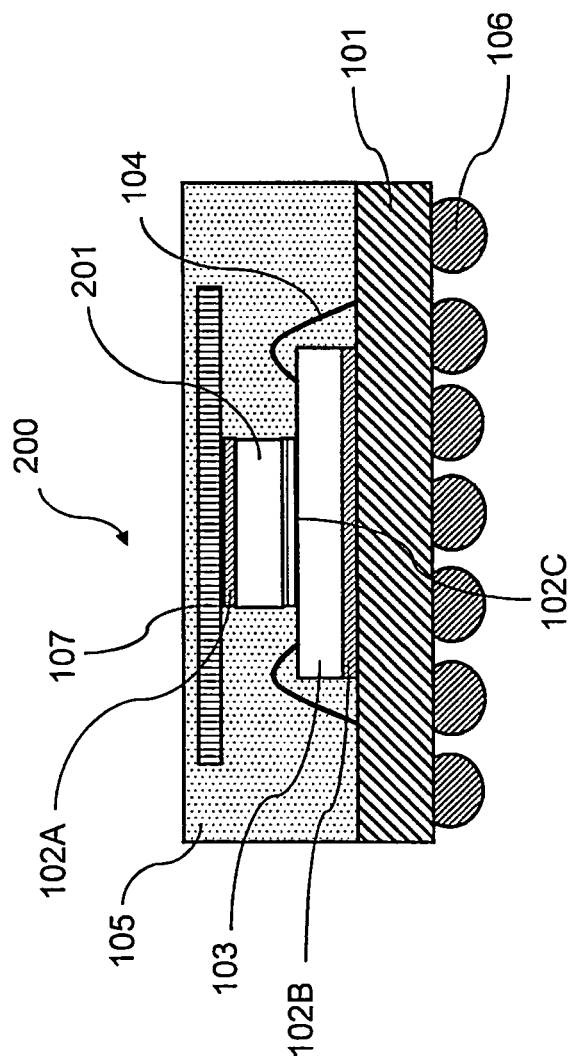
FIG. 5 is a cross sectional view related to a second embodiment of the present invention.

FIG. 5 is a cross sectional diagram which shows a general structure of a semiconductor device 200 related to the second embodiment. Furthermore, in the semiconductor device 200 related to the second embodiment, the heat dissipation component 107 is arranged between semiconductor elements 103 by a spacer 201. The remaining structure is the same as the structure explained in the first embodiment, therefore, a manufacturing method of the semiconductor device 200, and diagrams and explanations with respect to the heat dissipation of the semiconductor device 200 in the second embodiment are omitted.

As is shown in FIG. 5, in the semiconductor device 200 related to the second embodiment, the heat dissipation component 107 is arranged between semiconductor elements 103 by the spacer 201. As is shown in FIG. 5, the spacer 201 may be mounted on a semiconductor element 103 within a semiconductor device with a similar structure as the semiconductor device 100 in the first embodiment in order to secure the height of a bonding wire 104. Silicon for example may be used as the material of the spacer 201. While an example is shown in FIG. 5 wherein the spacer 201 is mounted between the semiconductor element 103 and the heat dissipation component 107 by an adhesive 102A, 102C, the adhesive 102A which fixes the heat dissipation component 107 and the spacer 201 to each other may be the same material as the adhesive 102B which fixes the semiconductor element 103 and the substrate 101 together or an adhesive comprised of a different material. However, the spacer 201 and the adhesive 102A are better to be a material having good thermal conductivity. And a size of the spacer 201 (x, y size) is also better to be large to the extent possible.

In addition, the shape of the spacer 201 in the second embodiment of the present invention is not limited to the shape of the spacer 201 shown in FIG. 5. The shape of the spacer 201 may be any shape as long as it is possible to maintain the height of the bonding wire 104 which connects the semiconductor element 103 and the substrate 101. Other structural elements and manufacturing method are the same as in the first embodiment. According to the second embodiment of the present invention, it is possible to obtain excellent heat dissipation from the heat dissipation component 107 of the present invention while maintaining the height of the bonding wire 104 which connects the semiconductor element 103 and the substrate 101.

Third Embodiment

The semiconductor device related to the third embodiment of the present invention will be explained while referring to the diagrams. The third embodiment of the present invention explains a structural example whereby a further semiconductor element 203 is arranged between the dissipation component 107 and the semiconductor element 103 in the semiconductor device 100 related to the first embodiment.

Figure 6:
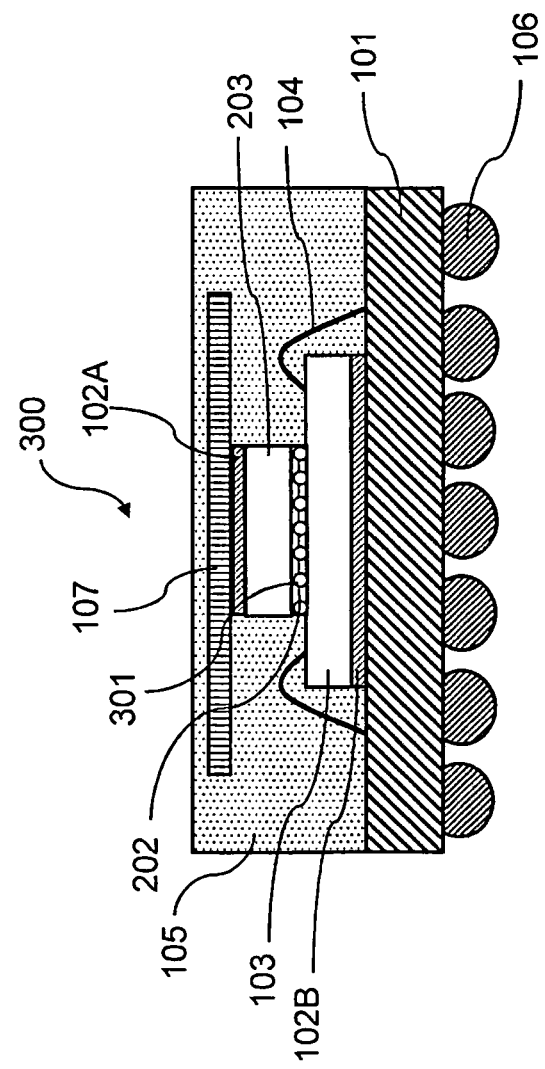
FIG. 6 is a cross sectional view related to a third embodiment of the present invention.

FIG. 6 is a diagram which shows a general structure of the semiconductor device 300 related to the third embodiment. Furthermore, in the semiconductor device 300 related to the third embodiment of the present invention, a further semiconductor element 203 is arranged between the dissipation component 107 and the semiconductor element 103. The remaining structure is the same as the structure explained in the first embodiment, therefore, a manufacturing method of the semiconductor device 300, and diagrams and explanations with respect to the heat dissipation of the semiconductor device 300 in the third embodiment are omitted.

As is shown in FIG. 6, in the semiconductor device 300 related to the third embodiment of the present invention, a further semiconductor element 203 is arranged between the dissipation component 107 and the semiconductor element 103. The number of semiconductor elements arranged on the semiconductor device related to the present invention is not limited to one. A plurality of stacked semiconductor elements may be arranged. A cross sectional structure in the third embodiment of the present invention whereby the semiconductor elements are chip stack mounted is shown in FIG. 6. Two stacked semiconductor elements 103 and 203 are electrically connected by a connection terminal 301 such as a solder bump, and the space between connection terminals is molded by an underfill resin 202. The upper level semiconductor element 203 is connected to the heat dissipation component 107 by the adhesive 102A as in the first embodiment, and the entire heat dissipation component 107 is molded by being buried with the mold component 105.

In FIG. 6 an example is shown whereby the upper level semiconductor element 203 is chip stack mounted on the lower level semiconductor element 103. However, the stacking structure of the semiconductor device related to the third embodiment of the present invention is not limited to this example. Other structural elements and manufacturing methods are the same as in the first embodiment.

According to the third embodiment of the present invention it is possible to obtain a highly functional semiconductor device which is mounted with a plurality of semiconductor elements and which has excellent heat dissipation by using the heat dissipation component 107 of the present invention.

Fourth Embodiment

The semiconductor device 400 related to the fourth embodiment of the present invention will be explained while referring to the diagrams. The fourth embodiment of the present invention explains an example whereby the structure of the heat dissipation component in the semiconductor device 100 related to the first embodiment is changed.

Figure 7:
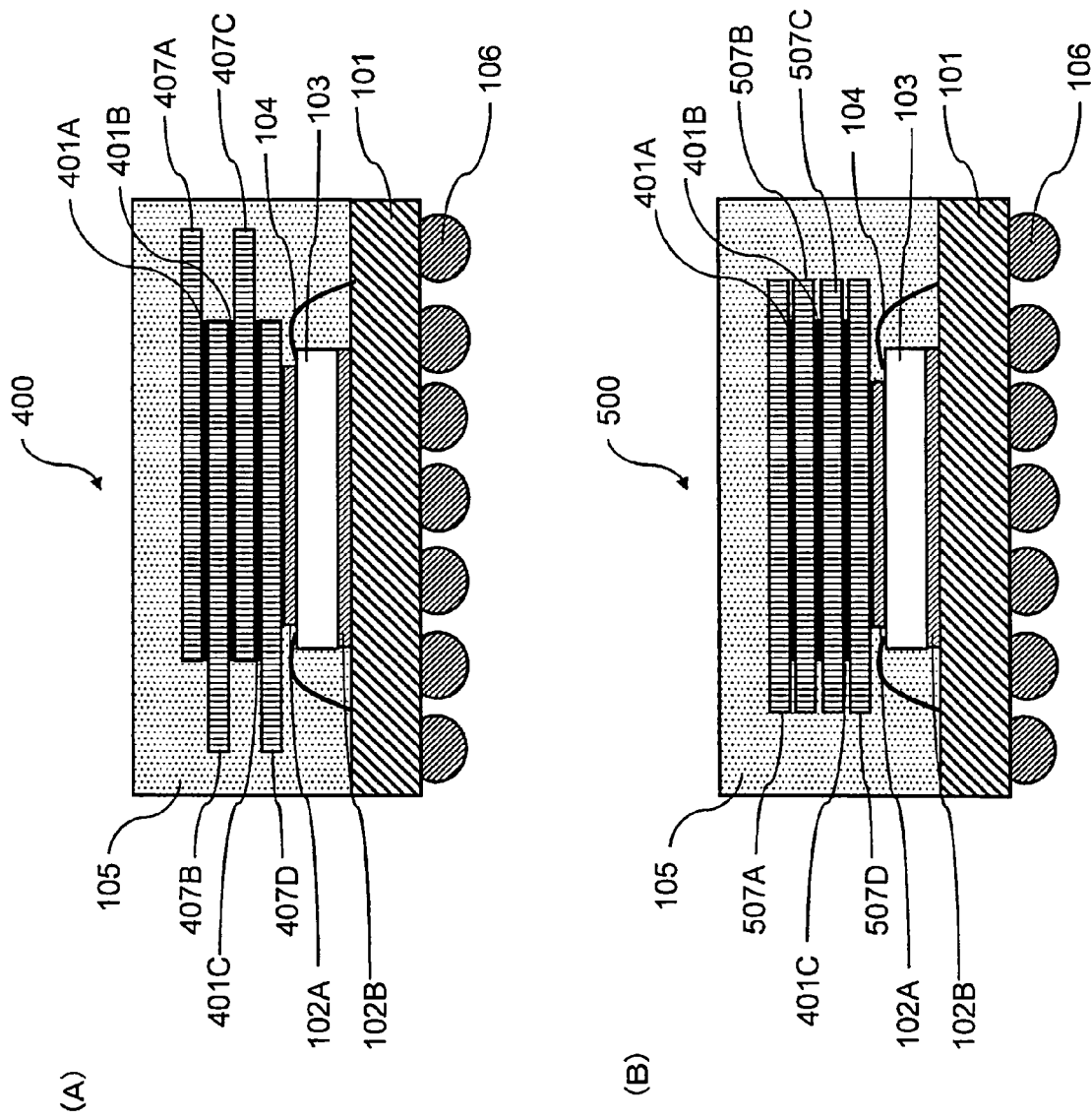
FIG. 7 (A) is a cross sectional view related to a fourth embodiment of the present invention.

FIG. 7 (A) and FIG. 7 (B) are diagrams which show a general structure of the semiconductor device 400 related to the fourth embodiment. Furthermore, in the semiconductor device 400 related to the fourth embodiment the heat dissipation component 107 is comprised from a plurality of parts. The remaining structure is the same as the structure explained in the first embodiment, therefore, a manufacturing method of the semiconductor device 400, and diagrams and explanations with respect to the heat dissipation of the semiconductor device 400 in the fourth embodiment are omitted.

As is shown in FIG. 7 (A) and FIG. 7 (B), in the semiconductor device 400 and 500 related to the fourth embodiment, the heat dissipation component includes of a plurality of parts 407A-D and 507A-D. In the semiconductor device related to the present invention, the heat dissipation component may be comprised of not just one but a plurality of parts. FIG. 7 (A) and FIG. 7 (B) shows a cross sectional structure of the semiconductor device related to the present invention which is mounted with a plurality of heat dissipation components. The plurality of parts 407A-D or 507A-D are connected to each other by 401 A-C which is an adhesive or thermal interface material (TIM) etc., and the entire heat dissipation component is molded by being buried within the mold component 105.

The heat dissipation component which is comprised from a plurality of parts in the fourth embodiment may be stacked so that the side surface of the heat dissipation component includes bumps as is shown in FIG. 7 (A). In addition, the heat dissipation component which is comprised from a plurality of parts in the fourth embodiment may be stacked so that the side surface of the heat dissipation component is flat as is shown in FIG. 7 (B). Other structural elements and manufacturing methods are the same as in the first embodiment.

According to the fourth embodiment of the present invention, it is possible to manufacture a heat dissipation component having a desired height by stacking a plurality of parts 407A-D or 507A-D, and obtain a semiconductor device which has the same effects as the first embodiment. In addition, by stacking with the center position of the plurality of parts slightly misaligned so that the side surface of the heat dissipation component includes bumps as is shown in FIG. 7 (A), it is possible to increase the adhesion area between the heat dissipation component 107 and the mold component 105 and improve adhesion between the heat dissipation component 107 and the mold component 105.

Fifth Embodiment

The semiconductor device related to the fifth embodiment of the present invention will be explained while referring to the diagrams. The fifth embodiment of the present invention explains an example whereby the external shape of the heat dissipation component 107 in the semiconductor device 100 related to the first embodiment is changed.

FIG. 8 to FIG. 13 are diagrams which show an example of the external shape of the heat dissipation component 107 which is arranged on the semiconductor device related to the fifth embodiment. Furthermore, in the semiconductor device related to the fifth embodiment, the surface of the heat dissipation component 107 arranged on the semiconductor element 103 is not flat. The remaining structure is the same as the structure explained in the first embodiment, therefore, a manufacturing method of the semiconductor device and diagrams and explanations with respect to the heat dissipation of the semiconductor device in the fifth embodiment are omitted.

Figure 10:
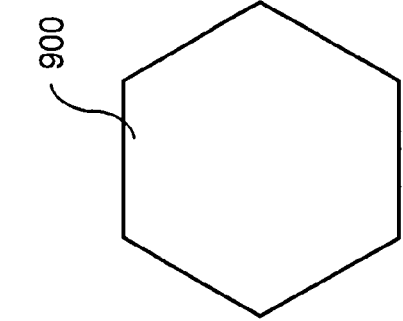
FIG. 10 is a plane view which shows an example in which the external shape of a heat dissipation component of the semiconductor device related to another embodiment of the present invention is changed.
Figure 9:
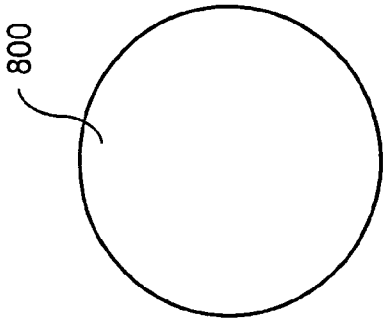
FIG. 9 is a plane view which shows an example in which the external shape of a heat dissipation component of the semiconductor device related to another embodiment of the present invention is changed.

The heat dissipation component arranged on the semiconductor device related to the fifth embodiment may be a heat dissipation component 700 shown in FIG. 8 having a square external flat surface, or a heat dissipation component 800 shown in FIG. 9 having a round external flat surface, or a heat dissipation component 900 shown in FIG. 10 having a regular hexagonal external flat surface. While a heat dissipation component 900 having a regular hexagonal shape is shown in FIG. 10, the polygon shape of the heat dissipation component arranged in the fifth embodiment is not limited to a regular hexagonal shape. Other polygonal shapes are also possible.

Figure 13:
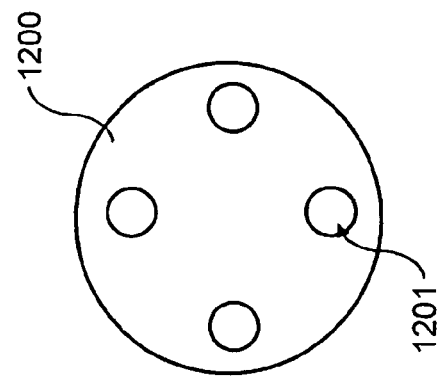
FIG. 13 is a plane view which shows an example in which the external shape of a heat dissipation component of the semiconductor device related to another embodiment of the present invention is changed.
Figure 12:
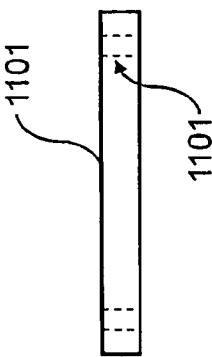
FIG. 12 is a plane view which shows an example in which the external shape of a heat dissipation component of the semiconductor device related to another embodiment of the present invention is changed.
Figure 11:
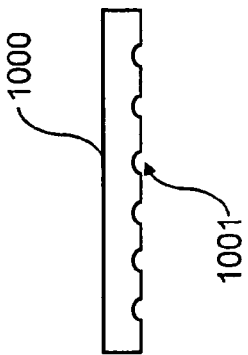
FIG. 11 is a plane view which shows an example in which the external shape of a heat dissipation component of the semiconductor device related to another embodiment of the present invention is changed.

In addition, the external shape of the heat dissipation component arranged on the semiconductor device related to the fifth embodiment may include bumps 1001, a plurality of small round or polygonal dimples on the surface of the heat dissipation component arranged on the semiconductor element 103 as in the heat dissipation component 1000 shown in FIG. 11, may include slits 1101 on the surface of the heat dissipation component arranged on the semiconductor element 103 as in the heat dissipation component 1100 shown in the cross section in FIG. 12, or may include holes 1201 on the surface of the heat dissipation component arranged on the semiconductor element 103 as in the heat dissipation component 1200 shown in the plane diagram in FIG. 13. Furthermore, the number of bumps 1001, slits 1101 or holes 1201 formed on the surface of the heat dissipation component arranged on the semiconductor element 103 may be one or a plurality. Other structural elements and manufacturing methods are the same as in the first embodiment.

According to the fifth embodiment of the present invention, by making the surface of the heat dissipation component arranged on the semiconductor element 103 not flat, it is possible to improve adhesion between the not flat surface of the heat dissipation component and the adhesive 102A, and obtain a semiconductor device with improved adhesion between the semiconductor element 103 and heat dissipation component.

Furthermore, the heat dissipation component shown in the first to fifth embodiments may also be formed from silicon. By using silicon which has an excellent thermal conductivity as the material of the heat dissipation component 107 it is possible obtain a semiconductor device which has excellent heat dissipation by using the heat dissipation component of the present invention.

Sixth Embodiment

The semiconductor device related to the sixth embodiment of the present invention will be explained while referring to the diagrams. The sixth embodiment of the present invention explains an example in which a plurality of semiconductor elements 103 in the semiconductor device 100 related to the first embodiment are aligned. Furthermore, in the semiconductor device 600 related to the sixth embodiment, a plurality of semiconductor elements 103 are aligned and arranged on the same substrate 101. The remaining structure is the same as the structure explained in the first embodiment, therefore, a manufacturing method of the semiconductor device 600 and diagrams and explanations with respect to the heat dissipation of the semiconductor device 600 in the sixth embodiment are omitted.

Figure 20:
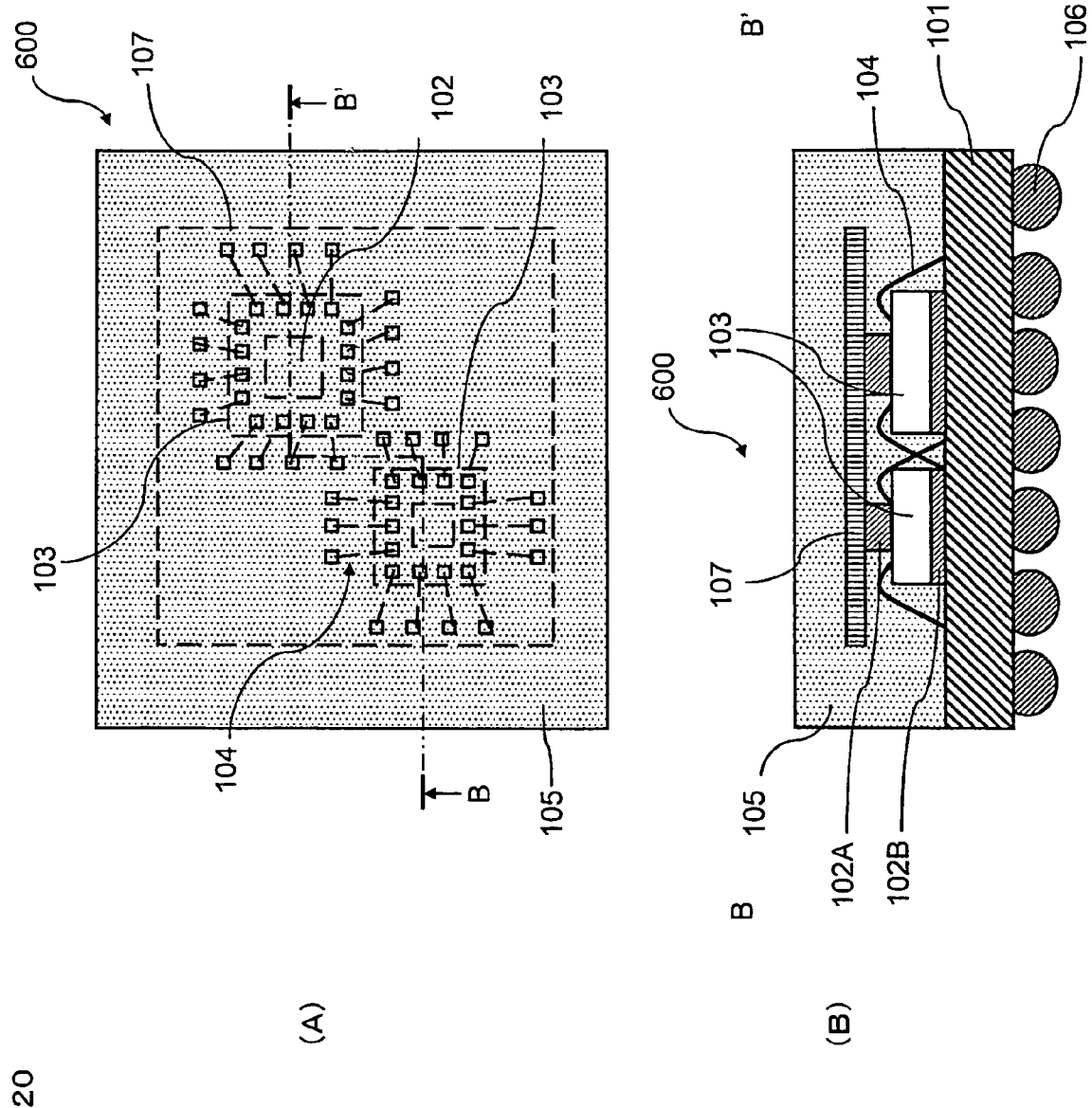
FIG. 20 (A) is a plane view which shows a general structure of a semiconductor device related to a sixth embodiment of the present invention.

FIG. 20 (A) and FIG. 20 (B) show a general structure of the semiconductor device 600 related to the sixth embodiment. FIG. 20 (A) is a plane diagram which shows a general structure of the semiconductor 600, and FIG. 20 (B) is a cross sectional diagram of the semiconductor device 600 seen from the line B-B' shown in FIG. 20 (A). The semiconductor device 600 is arranged with a substrate 101, a plurality of semiconductor elements 103 which are aligned and arranged on the substrate 101 by an adhesive 102B, a heat dissipation component 107 arranged on the semiconductor element 103 by an adhesive 102A, and a mold component 105 covering the upper part of the substrate 101, the semiconductor elements 103 and the heat dissipation component 107. While an example in shown in FIG. 20 in which two semiconductor elements 103 are arranged, the number of aligned and arranged semiconductor elements 103 is not limited to two.

According to the sixth embodiment of the present invention, in a semiconductor device 600 arranged with a plurality of aligned semiconductor elements 103, by mounting one heat dissipation component 107 with has a high thermal conductivity and is larger than the semiconductor elements 103, on the plurality of semiconductor elements 103, it is possible to transfer heat generated from each semiconductor element 103 to the mold component 105 on each semiconductor element 103, and by effectively diffusing the heat in a horizontal direction with the mold component 105, it is possible to widen the heat dissipation area, that is, heat dissipation path, from each semiconductor element 103 up to the surface of the mold component 105.

Seventh Embodiment

A semiconductor device related to the seventh embodiment of the present invention includes a substrate, a semiconductor element arranged on the substrate, a heat dissipation component arranged on the semiconductor element, and a mold component covering an upper part of the substrate, the semiconductor element and the heat dissipation component, wherein an area of a surface arranged on the semiconductor element of the heat dissipation component may be larger than an area of a surface on which the heat dissipation component of the semiconductor element is arranged.

In addition, in the semiconductor device related to the seventh embodiment of the present invention, the heat dissipation component may be formed from silicon.

In addition, in the semiconductor device related to the seventh embodiment of the present invention, the heat dissipation component may be formed from one or a plurality of stacked parts.

In addition, in the semiconductor device related to the seventh embodiment of the present invention, the shape of a side surface of the heat dissipation component may include bumps.

In addition, in the semiconductor device related to the seventh embodiment of the present invention, the shape of a side surface of the heat dissipation component may be flat.

In addition, in the semiconductor device related to the seventh embodiment of the present invention, the relationship between the surface area x of a surface arranged on a semiconductor element of the heat dissipation component with respect to the area of a surface on which a heat dissipation component of a semiconductor element is arranged, and thickness y of the heat dissipation component may be y≥224.0 x−0.5.

In addition, in the semiconductor device related to the seventh embodiment of the present invention, the heat dissipation component may be fixed on the semiconductor element by an adhesive.

In addition, in the semiconductor device related to the seventh embodiment of the present invention, the heat dissipation component may be fixed on a semiconductor element which is stacked on a semiconductor element by an adhesive.

In addition, in the semiconductor device related to the seventh embodiment of the present invention, the heat dissipation component may be fixed on a spacer which is stacked on a semiconductor element by an adhesive.

In addition, in the semiconductor device related to the seventh embodiment of the present invention, the adhesive may be grease.

In addition, in the semiconductor device related to the seventh embodiment of the present invention, the adhesive may be a thermal interface material.

In addition, in the semiconductor device related to the seventh embodiment of the present invention, the adhesive may be a paste.

In addition, in the semiconductor device related to the seventh embodiment of the present invention, a surface of the heat dissipation component which is arranged on the semiconductor element may be not flat.

In addition, in the semiconductor device related to the seventh embodiment of the present invention, a surface of the heat dissipation component which is arranged on the semiconductor element may include bumps.

In addition, in the semiconductor device related to the seventh embodiment of the present invention, a surface of the heat dissipation component which is arranged on the semiconductor element may include slits.

In addition, in the semiconductor device related to the seventh embodiment of the present invention, a surface of the heat dissipation component which is arranged on the semiconductor element may include holes.

The invention claimed is:

1. A semiconductor device comprising:
   a substrate;
   a semiconductor element arranged on the substrate;
   a spacer arranged on the semiconductor element by an adhesive;
   a mold component covering an upper part of the substrate, the semiconductor element and the spacer and
   a heat dissipation component arranged on the spacer, only on one side of the semiconductor element, and buried in the mold component, the heat dissipation component being a metal material,
   wherein an area of a surface of the heat dissipation component is larger than an area of a surface of the semiconductor element on which the spacer is arranged.

2. The semiconductor device according to claim 1, wherein the heat dissipation component includes one or a plurality of stacked parts.

3. The semiconductor device according to claim 2, wherein a surface of the heat dissipation component which is arranged on the spacer is not flat.

4. The semiconductor device according to claim 1, wherein the adhesive is a first adhesive and wherein the heat dissipation component is fixed on the spacer by a second adhesive.

5. The semiconductor device according to claim 4, wherein the second adhesive is grease, a thermal interface material or a paste.

6. The semiconductor device according to claim 5, wherein a surface of the heat dissipation component which is arranged on the spacer is not flat.

7. The semiconductor device according to claim 4, wherein a surface of the heat dissipation component which is arranged on the spacer is not flat.

8. The semiconductor device according to claim 1, wherein the adhesive is a first adhesive and wherein the spacer is fixed on another semiconductor element which is stacked on the semiconductor element by a second adhesive.

9. The semiconductor device according to claim 8, wherein the second adhesive is grease, a thermal interface material or a paste.

10. The semiconductor device according to claim 9, wherein a surface of the heat dissipation component which is arranged on the semiconductor element includes bumps.

11. The semiconductor device according to claim 9, wherein a surface of the heat dissipation component which is arranged on the semiconductor element includes slits or holes.

12. The semiconductor device according to claim 8, wherein a surface of the heat dissipation component which is arranged on the spacer is not flat.

13. The semiconductor device according to claim 1, wherein the adhesive is grease, a thermal interface material or a paste.

14. The semiconductor device according to claim 1, wherein a surface of the heat dissipation component which is arranged on the spacer is not flat.

15. The semiconductor device according to claim 1, wherein the heat dissipation component is embedded by the mold component.

* * * * *